United States Patent
Kang et al.

(10) Patent No.: US 8,576,162 B2
(45) Date of Patent: Nov. 5, 2013

(54) MANUFACTURING PROCESSES OF BACKPLANE FOR SEGMENT DISPLAYS

(75) Inventors: Gary Y. M. Kang, Fremont, CA (US); Ryne M. H. Shen, Tainan (TW); Fei Wang, Fremont, CA (US); Yi-Shung Chaug, Cupertino, CA (US)

(73) Assignee: Sipix Imaging, Inc., Fremont, CA (US)

( * ) Notice: Subject to any disclaimer, the term of this patent is extended or adjusted under 35 U.S.C. 154(b) by 1762 days.

(21) Appl. No.: 11/364,843

(22) Filed: Feb. 27, 2006

(65) Prior Publication Data

US 2006/0215106 A1    Sep. 28, 2006

Related U.S. Application Data

(60) Provisional application No. 60/661,740, filed on Mar. 14, 2005.

(51) Int. Cl.
G09G 3/34 (2006.01)
H05K 1/00 (2006.01)
C09K 19/52 (2006.01)

(52) U.S. Cl.
USPC .............. 345/107; 174/258; 349/182

(58) Field of Classification Search
USPC ........................................... 345/107
See application file for complete search history.

(56) References Cited

U.S. PATENT DOCUMENTS

| | | | | |
|---|---|---|---|---|
| 3,756,693 A | * | 9/1973 | Ota | 345/107 |
| 4,188,472 A | * | 2/1980 | Chang | 528/75 |
| 4,459,320 A | * | 7/1984 | Fefferman | 427/493 |
| 5,019,748 A | * | 5/1991 | Appelberg | 315/169.3 |
| 5,754,332 A | | 5/1998 | Crowley | |
| 5,905,558 A | | 5/1999 | Tokunaga et al. | |
| 5,930,026 A | | 7/1999 | Jacobson et al. | |
| 5,961,804 A | | 10/1999 | Jacobson et al. | |
| 6,207,268 B1 | * | 3/2001 | Kosaka et al. | 428/325 |
| 6,232,950 B1 | | 5/2001 | Albert et al. | |
| 6,391,523 B1 | * | 5/2002 | Hurditch et al. | 430/280.1 |
| 6,420,276 B2 | * | 7/2002 | Oku et al. | 438/758 |
| 6,497,942 B2 | | 12/2002 | Sheridon et al. | |
| 6,533,888 B2 | | 3/2003 | Natarajan et al. | |

(Continued)

FOREIGN PATENT DOCUMENTS

| | | |
|---|---|---|
| EP | 1296311 A2 | 3/2003 |
| JP | H04-199696 | 7/1992 |
| JP | 09274194 A * | 10/1997 |
| WO | WO 2006/099557 | 9/2006 |

OTHER PUBLICATIONS

International Search Report for PCT/US2006/009611, mailed May 27, 2008.

(Continued)

*Primary Examiner* — Timothy Thompson
*Assistant Examiner* — Nathan Milakovich
(74) *Attorney, Agent, or Firm* — Perkins Coie LLP

(57) ABSTRACT

The present invention relates to design and processes for the manufacture of backplane for segment displays. The process comprises: a) forming conductive lines on a non-conductive substrate layer; b) covering the conductive lines with a photoimageable material; c) forming conductive areas connected to the conductive lines and embedded in the photoimageable material; d) plating a conductive material over the photoimageable material to form segment electrodes; and e) optionally filling gaps between said segment electrodes with a thermal or radiation curable material followed by hardening said thermal or radiation curable material.

16 Claims, 9 Drawing Sheets

(56) References Cited

U.S. PATENT DOCUMENTS

| | | | |
|---|---|---|---|
| 6,588,131 B2 | 7/2003 | O'Connell, Jr. | |
| 6,672,921 B1* | 1/2004 | Liang et al. | 445/24 |
| 6,784,953 B2 | 8/2004 | Liang et al. | |
| 6,795,138 B2 | 9/2004 | Liang et al. | |
| 6,800,166 B2* | 10/2004 | Kosaka et al. | 156/230 |
| 6,825,068 B2* | 11/2004 | Denis et al. | 438/149 |
| 6,850,357 B2* | 2/2005 | Kaneko et al. | 359/296 |
| 6,870,662 B2* | 3/2005 | Tseng et al. | 359/296 |
| 6,888,606 B2 | 5/2005 | Hinata et al. | |
| 6,909,532 B2* | 6/2005 | Chung et al. | 359/296 |
| 6,930,818 B1 | 8/2005 | Liang et al. | |
| 6,933,098 B2 | 8/2005 | Chan-Park et al. | |
| 6,982,178 B2* | 1/2006 | LeCain et al. | 438/22 |
| 7,301,693 B2 | 11/2007 | Chaug et al. | |
| 2002/0163614 A1* | 11/2002 | Hinata et al. | 349/139 |
| 2003/0152849 A1* | 8/2003 | Chan-Park et al. | 430/22 |
| 2003/0197916 A1* | 10/2003 | Chung et al. | 359/296 |
| 2003/0206331 A1* | 11/2003 | Chung et al. | 359/296 |
| 2004/0131779 A1* | 7/2004 | Haubrich et al. | 427/261 |
| 2004/0150141 A1 | 8/2004 | Chao et al. | |
| 2004/0182711 A1 | 9/2004 | Liang et al. | |
| 2004/0219306 A1* | 11/2004 | Wang et al. | 428/1.5 |
| 2004/0252360 A1* | 12/2004 | Webber et al. | 359/296 |
| 2005/0106329 A1* | 5/2005 | Lewis et al. | 427/457 |
| 2005/0243406 A1* | 11/2005 | Chung et al. | 359/296 |
| 2006/0033981 A1* | 2/2006 | Chaug et al. | 359/296 |
| 2006/0063351 A1* | 3/2006 | Jain | 438/455 |
| 2006/0132428 A1* | 6/2006 | Liu et al. | 345/107 |
| 2006/0145611 A1 | 7/2006 | Joo et al. | |
| 2007/0237962 A1* | 10/2007 | Liang et al. | 428/411.1 |

OTHER PUBLICATIONS

Allen, K. (Oct. 2003). Electrophoretics Fulfilled. *Emerging Displays Review: Emerging Display Technologies, Monthly Report*—Oct. 2003, 9-14.

Bardsley, J.N. & Pinnel, M.R. (Nov. 2004) Microcup™ Electrophoretic Displays. *USDC Flexible Display Report*, 3.1.2. pp. 3-12-3-16.

Chaug, Y.S., Haubrich, J.E., Sereda, M. and Liang, R.C. (Apr. 2004). Roll-to-Roll Processes for the Manufacturing of Patterned Conductive Electrodes on Flexible Substrates. *Mat. Res. Soc. Symp. Proc.*, vol. 814, I9.6.1.

Chen, S.M. (Jul. 2003) The Applications for the Revolutionary Electronic Paper Technology. *OPTO News & Letters*, 102, 37-41. (in Chinese, English abstract attached).

Chen, S.M. (May 2003) The New Applications and the Dynamics of Companies. *TRI.* 1-10. (in Chinese, English abstract attached).

Chung, J., Hou, J., Wang, W., Chu, L.Y., Yao, W., & Liang, R.C. (Dec. 2003). Microcup(R) Electrophoretic Displays, Grayscale and Color Rendition. *IDW*, AMD2/EP1-2, 243-246.

Ho, Candice. (Feb. 1, 2005) *Microcupt® Electronic Paper Device and Applicaiton*. Presentation conducted at USDC 4th Annual Flexible Display Conference 2005.

Ho, C.,& Liang, R.C. (Dec. 2003). *Microcup (R) Electronic Paper by Roll-to-Roll Manufacturing Processes*. Presentation conducted at FEG, Nei-Li, Taiwan.

Hopper, M. A. et al, "An Electrophoretic Display, its Properties, Model and Addressing", IEEE Transactions on Electron Devices, 26(8): 1148-1152 (1979).

Hou, J., Chen, Y., Li, Y., Weng, X., Li, H. and Pereira, C. (May 2004). Reliability and Performance of Flexible Electrophoretic Displays by Roll-to-Roll Manufacturing Processes. *SID Digest*, 32.3, 1066-1069.

Lee, H., & Liang, R.C. (Jun. 2003) SiPix Microcup(R) Electronic Paper—An Introduction. *Advanced Display*, Issue 37, 4-9 (in Chinese, English abstract attached).

Liang, R.C. (Feb. 2003) *Microcup(R) Electrophoretic and Liquid Crystal Displays by Roll-to-Roll Manufacturing Processes*. Presentation conducted at the Flexible Microelectronics & Displays Conference of U.S. Display Consortium, Phoenix, Arizona, USA.

Liang, R.C. (Apr. 2004). *Microcup Electronic Paper by Roll-to-Roll Manufacturing Process*. Presentation at the Flexible Displays & Electronics 2004 of Intertech, San Fransisco, California, USA.

Liang, R.C. (Oct. 2004) *Flexible and Roll-able Display/Electronic Paper—A Technology Overview*. Paper presented at the METS 2004 Conference in Taipie, Taiwan.

Liang, R.C., (Feb. 2005) *Flexible and Roll-able Displays/Electronic Paper—A Brief Technology Overview*. Flexible Display Forum, 2005, Taiwan.

Liang, R.C., Hou, J., Chung, J., Wang, X., Pereira, C., & Chen, Y. (2003). Microcup(R) Active and Passive Matrix Electrophoretic Displays by A Roll-to-Roll Manufacturing Processes. *SID Digest*, 20.1.

Liang, R.C., Hou, J., & Zang, H.M. (Dec. 2002) Microcup Electrophoretic Displays by Roll-to-Roll Manufacturing Processes. *IDW*, EP2-2, 1337-1340.

Liang, R.C., Hou, J., Zang, H.M., & Chung, J. (Feb. 2003). *Passive Matrix Microcup(R) Electrophoretic Displays*. Paper presented at the IDMC, Taipei, Taiwan.

Liang, R.C., Hou, J., Zang, H.M., Chung, J., & Tseng, S. (2003). Microcup(R) displays: Electronic Paper by Roll-to-Roll Manufacturing Processes. *Journal of the SID*, 11(4), 621-628.

Liang, R.C., Zang, H.M., Wang, X., Chung, J. & Lee, H., (Jun./Jul. 2004) << Format Flexible Microcup (R) Electronic Paper by Roll-to-Roll Manufacturing Process >>, Presentation conducted at the 14th FPD Manufacturing Technology EXPO & Conference.

Liang, R.C., & Tseng, S. (Feb. 2003). *Microcup(R) LCD, An New Type of Dispersed LCD by a Roll-to-Roll Manufacturing Process*. Paper presented at the IDMC, Taipei, Taiwan.

Mossman, M.A. et al, (2000) New Reflective Display Based on Total Internal Reflection in Prismatic Microstructure. *SID IDRC Proceeding*, pp. 311-314.

Mossman, M.A. et al, (2001) New Reflective Color Display Technique Based on Total Internal Reflection and Subtractive Color Filtering. *SID 2001 Digest*, pp. 1054-1057.

Mossman, M.A. et al, (2002) Grey Scale Control of TIR Using Electrophoresis of Sub-Optical Pigment Particles. *SID 2002 Digest*, pp. 522-525.

Nikkei Microdevices. (Dec. 2002) Newly-Developed Color Electronic Paper Promises—Unbeatable Production Efficiency. *Nikkei Microdevices*, 3. (in Japanese, with English translation).

Wang, et al., (Feb. 2006) *Inkjet Fabrication of Multi-Color Microcup® Electrophorectic Display*. The Flexible Microelectronics & Displays Conference of U.S. Display Consortium, Feb. 9, 2006.

Wang, X., Kiluk, S., Chang, C., & Liang, R.C. (Feb. 2004). Mirocup (R) Electronic Paper and the Converting Processes. *ASID*, 10.1.2-26, 396-399, Nanjing, China.

Wang, X., Kiluk, S., Chang, C., & Liang, R.C., (Jun. 2004) Microcup® Electronic Paper and the Converting Processes. *Advanced Display*, Issue 43, 48-51.

Zang, H.M. (Feb. 2004). *Microcup Electronic Paper*. Presentation conducted at the Displays & Microelectronics Conference of U.S. Display Consortium, Phoenix, Arizona, USA.

Zang, H.M. (Oct. 2003). *Microcup (R) Electronic Paper by Roll-to-Roll Manufacturing Processes*. Presentation conducted at the Advisory Board Meeting, Bowling Green State University, Ohio, USA.

Zang, H.M.Hou, Jack, (Feb. 2005) *Flexible Microcup® EPD by RTR Process*. Presentation conducted at 2nd Annual Paper-Like Displays Conference, Feb. 9-11, 2005, St. Pete Beach, Florida.

Zang, H.M, Hwang, J.J., Gu, H., Hou, J., Weng, X., Chen, Y., et al. (Jan. 2004). Threshold and Grayscale Stability of Microcup (R) Electronic Paper. *Proceeding of SPIE-IS&T Electronic Imaging, SPIE* vol. 5289, 102-108.

Zang, H.M., & Liang, R.C. (2003) Microcup Electronic Paper by Roll-to-Roll Manufacturing Processes. *The Spectrum*, 16(2), 16-21.

* cited by examiner

MANUFACTURING PROCESSES OF BACKPLANE FOR SEGMENT DISPLAYS

RELATED APPLICATION

This application claims the priorities under 35 USC 119(e) of U.S. Provisional Application No. 60/661,740, filed Mar. 14, 2005. The whole content of the priority application is incorporated herein by reference in its entirety.

FIELD OF THE INVENTION

The present invention relates to design and manufacturing processes of backplane for segment displays.

BACKGROUND OF THE INVENTION

In a direct drive (or segment) display, a display panel typically is sandwiched between a common electrode layer and a backplane. The common electrode layer is a single electrode layer which covers the entire display area. The backplane comprises a substrate layer on which a desired graphic pattern is formed with a conductive material. The display panel may be an electrophoretic display, a liquid crystal display or other types of display, such as that prepared by the Gyricon technology.

An electrophoretic display (EPD) is a non-emissive device based on the electrophoresis phenomenon influencing the migration of charged pigment particles in a solvent, preferably a dielectric solvent. This type of display was first proposed in 1969. An EPD typically comprises a pair of opposed, spaced-apart plate-like electrodes, with spacers predetermining a certain distance between them. At least one of the electrodes, typically on the viewing side, is transparent. An electrophoretic dispersion composed of a dielectric solvent and charged pigment particles dispersed therein is enclosed between the two plates. When a voltage difference is imposed between the two electrodes, the charged pigment particles migrate by attraction to the plate of polarity opposite that of the pigment particles. Thus, the color showing at the transparent plate, determined by selectively charging the plates, may be either the color of the solvent or the color of the pigment particles. Reversal of plate polarity will cause the particles to migrate back to the opposite plate, thereby reversing the color. Intermediate color density (or shades of gray) due to intermediate pigment density at the transparent plate may be obtained by controlling the plate charge through a range of voltages or pulsing time.

EPDs of different pixel or cell structures were reported previously, for example, the partition-type EPD [M. A. Hopper and V. Novotny, IEEE Trans. Electr. Dev., Vol. ED 26, No. 8, pp. 1148-1152 (1979)], the microencapsulated EPD (U.S. Pat. Nos. 5,961,804 and 5,930,026 and US applications, Ser. No. 60/443,893, filed Jan. 30, 2003 and Ser. No. 10/766,757, filed on Jan. 27, 2004) and the total internal reflection (TIR) type of EPD using microprisms or microgrooves as disclosed in M. A. Mossman, et al, SID 01 Digest pp. 1054 (2001); SID IDRC proceedings, pp. 311 (2001); and SID'02 Digest, pp. 522 (2002).

An improved EPD technology was disclosed in U.S. Pat. Nos. 6,930,818, 6,672,921 and 6,933,098, the contents of all of which are incorporated herein by reference in their entirety. The improved EPD comprises isolated cells formed from microcups and filled with charged pigment particles dispersed in a dielectric solvent. To confine and isolate the electrophoretic dispersion in the cells, the filled cells are top-sealed with a polymeric sealing layer, preferably formed from a composition comprising a material selected from the group consisting of thermoplastics, thermoplastic elastomers, thermosets and precursors thereof.

In an electrophoretic segment display, the charged pigment particles in the display panel in the area of the desired graphic pattern may migrate to either the side of the common electrode layer or the side of the backplane, depending on the voltage difference between the common electrode layer and the conductive pattern.

A liquid crystal display comprising display cells prepared by the microcup technology and filled with a liquid crystal composition optionally comprising a dichroic dye was disclosed in U.S. Pat. Nos. 6,795,138 and 6,784,953.

A display panel may also be prepared by the Gyricon technology (as disclosed in U.S. Pat. No. 6,588,131 assigned to Gyricon Media, Inc. and U.S. Pat. Nos. 6,497,942, and 5,754,332 assigned to Xerox). A Gyricon sheet is a thin layer of transparent plastic in which millions of small beads, somewhat like toner particles, are randomly dispersed. The beads, each contained in an oil-filled cavity, are free to rotate within those cavities. The beads are "bichromal" with hemispheres of two contrasting colors (e.g., black and white, red and white), and charged so they exhibit an electrical dipole. When a voltage is applied to the surface of the sheet, the beads rotate to present one colored side to the viewer. Voltages can be applied to the surface to create images such as text and pictures. The image will persist until new voltage patterns are applied.

The desired graphic pattern in a segment display may be alphabet letters, numerical displays (such as those utilizing the well-known 7 or 14 segment electrodes), logos, signs or other graphic designs.

The backplane is usually formed of a flexible or rigid printed circuit board. The conventional process for the manufacture of a printed circuit board involves multiple steps. The segment electrodes and conductive lines are first fabricated on the opposite sides of a non-conductive substrate layer laminated or coated with a conductive metal, and electrically connected to each other through copper-plated via holes. During formation of the via holes, steps of drilling, electroless plating, electroplating and plugging the copper-plated via holes with a non-conductive resin are employed. Since the entire area on each segment electrode must be electrically conductive and flat, steps of brushing and polishing are then needed to remove any protrusions associated with the copper-plated via holes plugged with the non-conductive resin, before the subsequent plating and segment patterning steps. In addition, the gaps between segment electrodes formed in the conventional process usually have a depth in the range of about 30 to about 60 um or even higher. Gaps of such a significant depth could be detrimental to the display panel laminated over the backplane, especially the display panel formed from the microcup technology. Therefore, additional gap-plugging steps such as solder mask coating, photolithography and brushing are required to planarize the gaps. The entire process therefore is not only costly and complex but also of a low yield.

It is noted that the whole content of each document referred to in this application is incorporated by reference into this application in its entirety.

SUMMARY OF THE PRESENT INVENTION

The present invention is directed to a backplane design for a display panel, in particular, a direct drive display panel.

The present invention is also directed to processes for the manufacture of backplane for segment displays.

The processes of the present invention involve fewer steps and are therefore more cost effective.

DETAILED DESCRIPTION OF THE PRESENT INVENTION

Figure 1A:
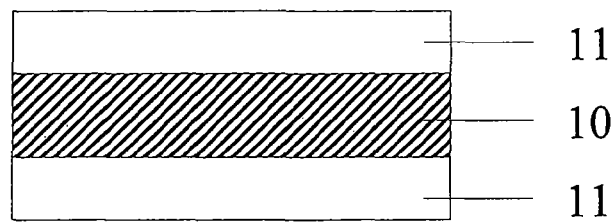
FIGS. 1A-1H demonstrate a partial process for backplane manufacture.

FIGS. 1A-1H illustrate a partial process for backplane manufacture. The process is carried out on a non-conductive substrate layer (10) with a conductive metal (11) (such as aluminum, tin, zinc, nickel or copper, preferably copper or a copper-containing alloy) laminated or coated on both sides as shown in FIG. 1A.

Figure 1B:
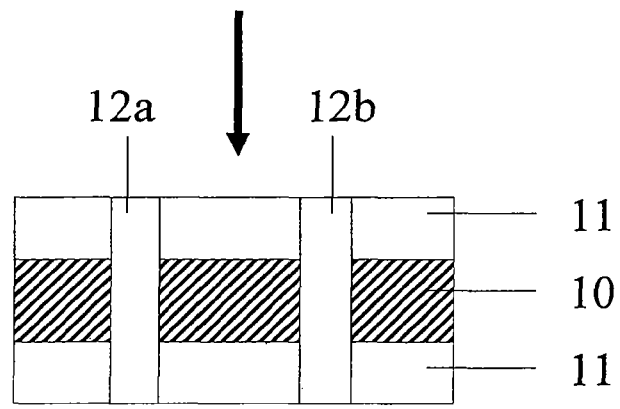
Figure 1C:
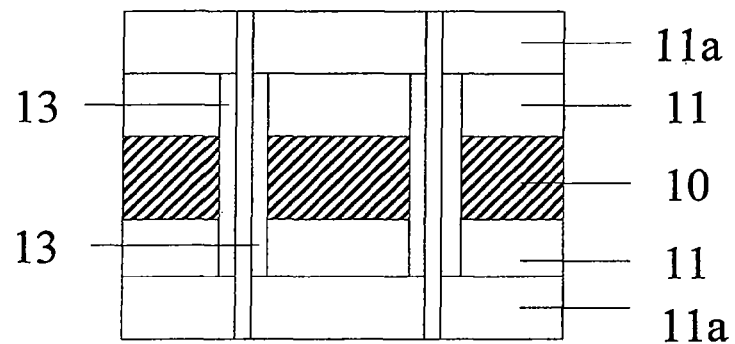

In FIG. 1B, via holes (12a and 12b) are formed by, for example, mechanical or laser drilling, followed by electroless plating and electroplating to coat the inner surface of the via holes with a conductive metal (13) such as copper, as shown in FIG. 1C. While the inner surface of the via holes are being plated with the conductive metal, the conductive metal layers (11) on both sides of the substrate layer (10) may become thickened (11a).

Figure 1D:
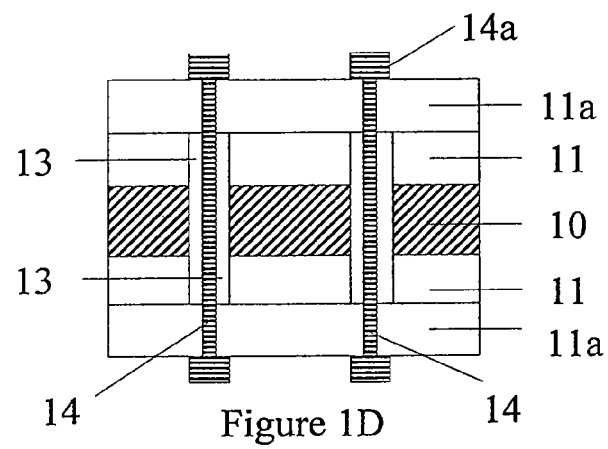

In FIG. 1D, the copper-plated via holes are plugged with a non-conductive resin (14) (such as a solder mask, adhesive or negative-tone photoresist, preferably a solder mask and negative-tone photoresist). This step may be accomplished using roller coating or screen printing. Once the non-conductive resin has been applied to the via holes, a thermal or radiation source will be used to cure the resin material. The protrusions (14a) formed from the resin material at the openings of the via holes are then removed by rotation or roller brushing as shown in FIG. 1E.

Figure 1E:
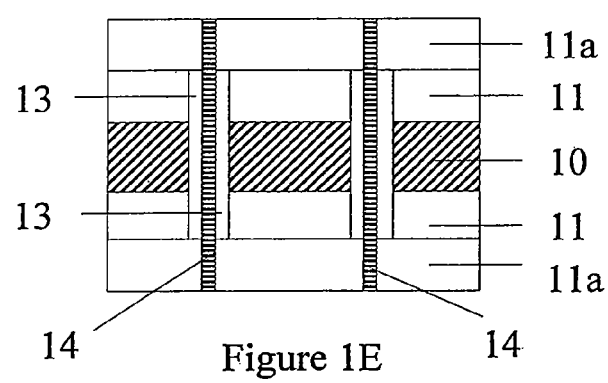
Figure 1F:
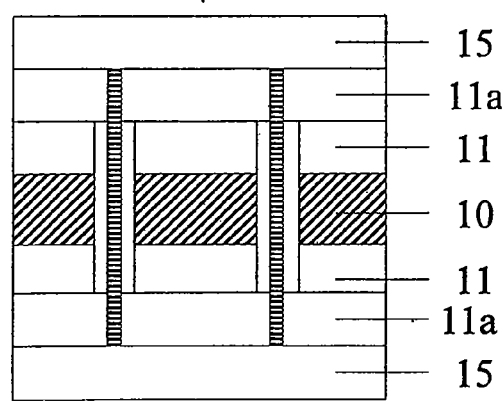
Figure 1G:
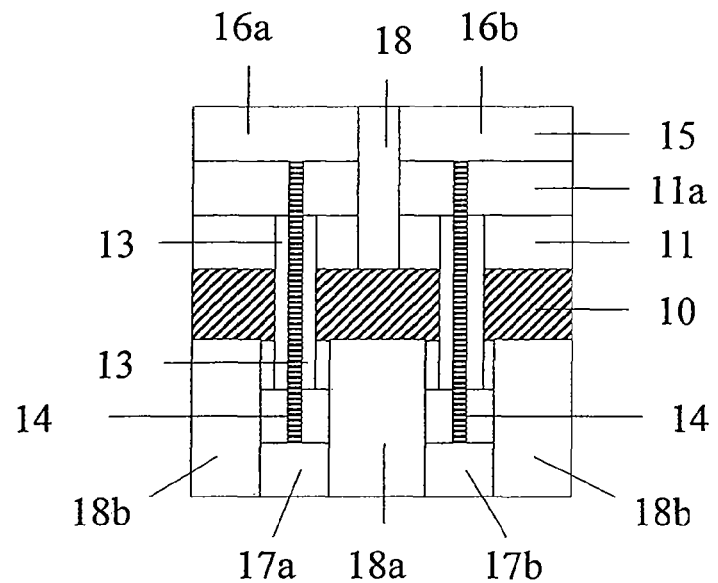

Since the entire area on each segment electrode must be electrically conductive, in FIG. 1F, further layers (15) of a conductive material are then plated on both sides of the film obtained from the step of FIG. 1E. To prepare the segment electrodes (16a and 16b) and conductive lines (17a and 17b) as shown in FIG. 1G, photolithography and etching are employed. As a result, each of the segment electrodes (16a or 16b) is connected to a conductive line (17a or 17b respectively) through the conductive metal (13) inside via hole (12a or 12b respectively). In the process of photolithography and etching, gaps (18) are created according to the desired segment design. The areas 18a must be emptied to separate the conductive lines (17a and 17b). The areas 18b may also be emptied if they are between two conductive lines.

The gaps (18) between the segment electrodes usually have a depth in the range of 30 to 60 micron. Gaps of such a significant depth could be detrimental to the display panel laminated over the backplane. Therefore the gaps are preferably plugged. In a conventional process for the manufacture of a printed circuit board, a photoimageable resist, normally of a negative tone, is coated on segment electrodes (16a and 16b) and filled in the gaps (18). After a radiation exposure step, the resist on the un-exposed areas, i.e., the areas above the segment electrodes, is selectively stripped using a suitable solvent. The protrusions, formed from the exposed resist on top of the gaps (18), are then removed by rotation or roller brushing. Such a gap-plugging process is not only costly and complex but also of a low yield.

Figure 2:
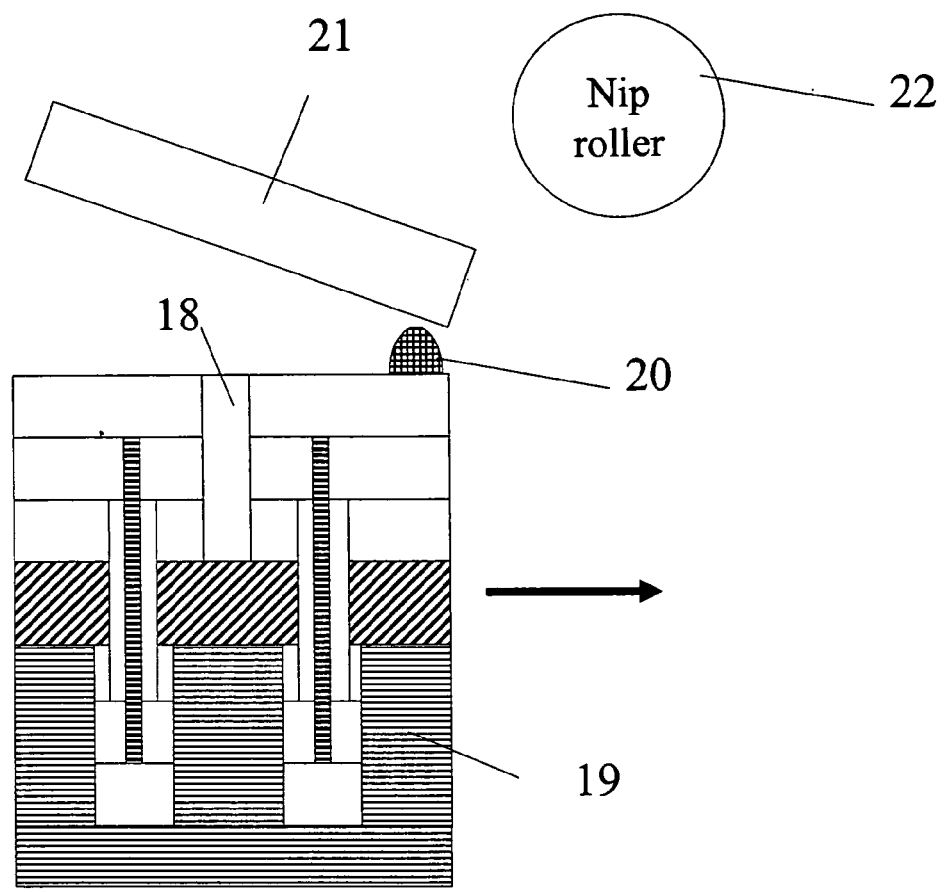
FIG. 2 illustrates a gap plugging process of the present invention.

The present invention provides a new gap plugging process as illustrated in FIG. 2. A radiation or thermal curable material (20) in the form of liquid is first applied to the top surface of the segment electrodes. A release film (21) is then laminated over the top surface to squeeze the radiation or thermal curable material into the gaps (18). Many thermal or radiation curable materials commercially available in the printed circuit board industry, e.g., a solder mask and hole plugging ink, are suitable for this application. In addition, radiation or thermal curable adhesives may also be used. To avoid the formation of "dip" on top of the plugged gaps, the radiation or thermal curable materials may have a more than 85% (w/w) solid content, preferably a substantially 100% (w/w) solid content. The viscosity of the material before curing is preferably in the range from about 10 cps to about 30,000 cps, more preferably from about 30 to about 10,000 cps. In some cases, it may be preferred to use a non-conductive material of a low dielectric constant for the gap plugging process to prevent the reverse bias issue associated with electrophoretic displays. The dielectric constant is preferably in the range of about 1 to about 30, more preferably in the range of about 1 to about 10. The lamination pressure may be precisely controlled by a nip roller (22) to reduce the amount of the radiation or thermal curable material remaining on the top surface of the segment electrodes. Practically, the thickness of radiation or thermal curable material remaining on the top surface of the segment electrodes can be as thin as 0.1 um or less. After the radiation or thermal curable material is filled in the gaps, a radiation or thermal source is applied to harden the curable material. Because its release characteristics, the release film (21) can be easily removed after the hardening step and leaves a planar surface without protrusions on top of the gaps.

This gap plugging process has many advantages. For example, the cumbersome steps of coating of a photoimageable material, photolithography and brushing used in the conventional process are all eliminated. Therefore the steps as described in FIG. 2 can be cleanly and efficiently carried out at low cost.

Figure 1H:
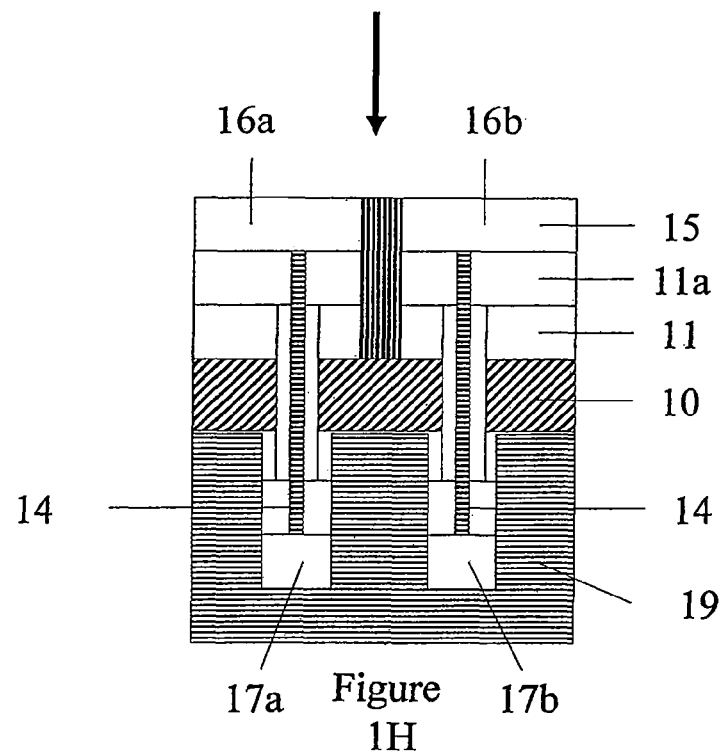

To complete the assembly of FIGS. 1A-1G, a solder mask or non-conductive material (19) may be subsequently applied to the side of conductive lines, as shown in FIG. 1H, to prevent conductive lines from corrosion or scratch. The solder mask or non-conductive material (19) may be applied either before or after gap plugging.

Figure 3A:
FIGS. 3A-3G illustrate an alternative process of the present invention.

An alternative process of the present invention for the manufacture of a backplane is illustrated in FIGS. 3A-3G. The process is carried out on a non-conductive substrate layer (30) laminated or coated with a conductive metal (31), as shown in FIG. 3A. The conductive metal may be laminated or coated on both sides of the substrate layer; however it is sufficient that only one side is laminated or coated. Suitable conductive metals are those described above, with copper as being the most frequently used. The thickness of the conductive metal layer is usually in the range of about 0.1 to about 100 micron, preferably in the range of about 1 to about 50 micron.

Figure 3B:
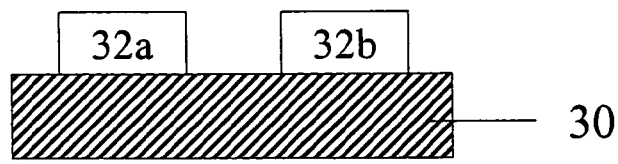
Figure 4A:
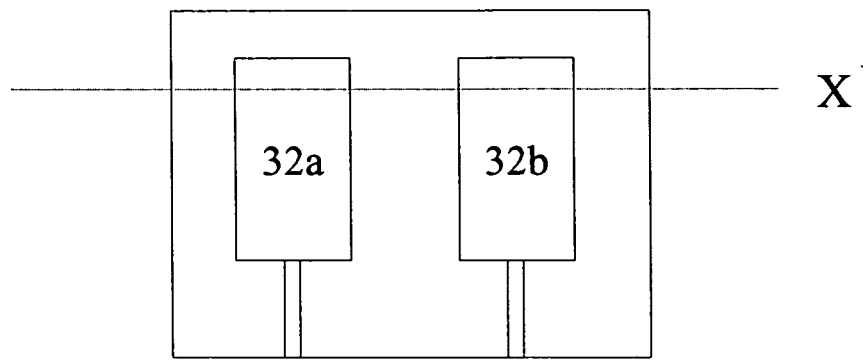
FIGS. 4A-4C illustrate the process of FIGS. 3A-3G, from the top view.

In FIG. 3B, conductive lines (32a and 32b) are formed from the conductive metal (31) by photolithography and etching. In practice, the conductive metal (31) is not just patterned to form thin and narrow lines as in a conventional printed circuit board process. Instead, each of the conductive lines (32a & 32b) can have a larger conductive area on one side, as shown in FIG. 4A. Using such a design, the alignment of photomask to expose its top layer, i.e., the photoimageable material (33) used in the subsequent step, may be easier.

Figure 3C:
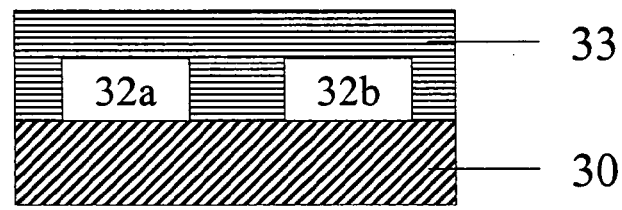

In FIG. 3C, a dielectric layer, preferably a photoimageable material (33), is formed over the conductive lines using die coating, curtain coating, dip coating, spin coating, spray coating, curtain coating or doctor blade coating. Suitable photoimageable materials may include, but are not limited to, commercially available photoimageable solder masks, negative tone photoresists and positive tone photoresists, with the epoxy-based solder mask as more preferred. The thickness of the photoimageable material is usually in the range of about 1 to about 1,000 micron, preferably in the range of about 2 to about 500 micron.

Figure 3D:
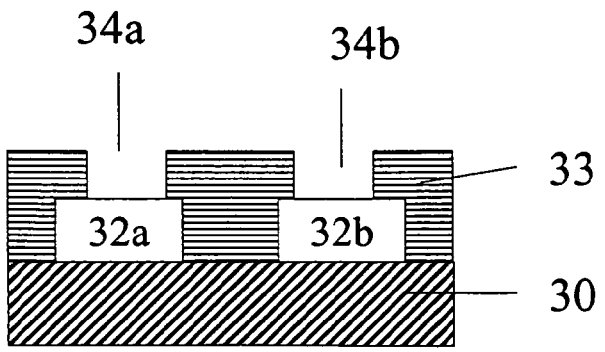

In FIG. 3D, the photoimageable material in areas (34a and 34b) connected to, preferably on top of, the conductive lines are removed by photolithography in order to create electrical connection between the conductive lines and the segment electrodes to be formed.

Figure 3E:
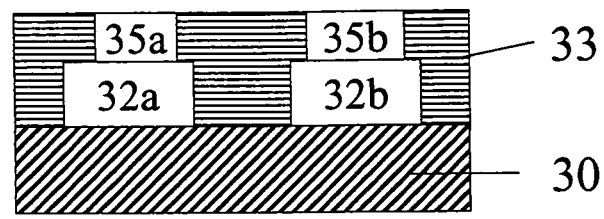

The open areas (34a and 34b) are then leveled with a conductive material (35a and 35b) via electroplating, as shown in FIG. 3E. Suitable conductive materials for this step may include, but are not limited to, copper, nickel, cobalt, tin, silver and gold, with copper as the most preferred. The thickness of the conductive material (35a and 35b) is controlled by electroplating time and current density so that the top of the conductive 35a and 35b is leveled with the top of the photoimageable material (33). Hence, the brushing step frequently used in the conventional process is not necessary.

Figure 3F:
Figure 3F:
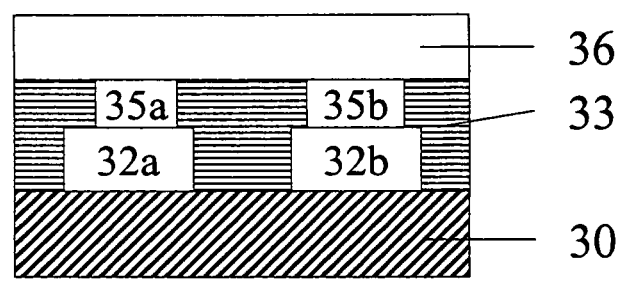
Figure 3G:
Figure 3G:
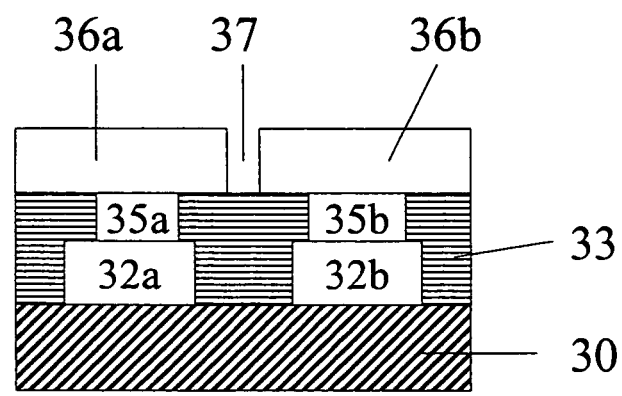

In FIG. 3F, a conductive metal (36) is plated over the photoimageable material with the conductive areas (35a and 35b) embedded in the photoemageable material. Since the photoimageable material (33) is non-conductive, an electroless plating step prior to electroplating step is needed to provide a thin seed layer. The segment electrodes (36a and 36b) are then formed via photolithography and etching. Each of the segment electrodes (36a and 36b) is connected to a conductive line (32a and 32b respectively) via a conductive area (35a and 35b respectively) as shown in FIG. 3G. The conductive lines (32a and 32b) are connected to a power source for driving the segment electrodes.

Alternatively, the conductive metal (35a, 35b and 36) can be plated in one step if the electroplating system possesses good throwing power. Two approaches can be used to increase the throwing power. One approach involves incorporating a high current density polarizer (or inhibitor) and a macro leveler into an electroplating solution to enhance the low current density deposition. The other approach involves using pulse current to electroplate the metal. Both approaches are commercially available, e.g., Technic CU 3000 and TechniPulse 5300 processes of Technic Inc. In this case, before the electroplating step, an electroless plating step is employed to provide a thin seed layer on the surface of the patterned photoimageable material (33) in FIG. 3D.

The depth of the gap (37) between the segment electrodes may be controlled by electroplating time and current density to be as thin as about 1 to about 5 microns. The depth depends on the thickness of the conductive metal (36) plated. If the thickness of the conductive metal (36) (in turn the depth of the gaps) is unacceptably high, the gap plugging process as described in FIG. 2 may be applied to eliminate the gaps.

Figure 4B:
Figure 4B:
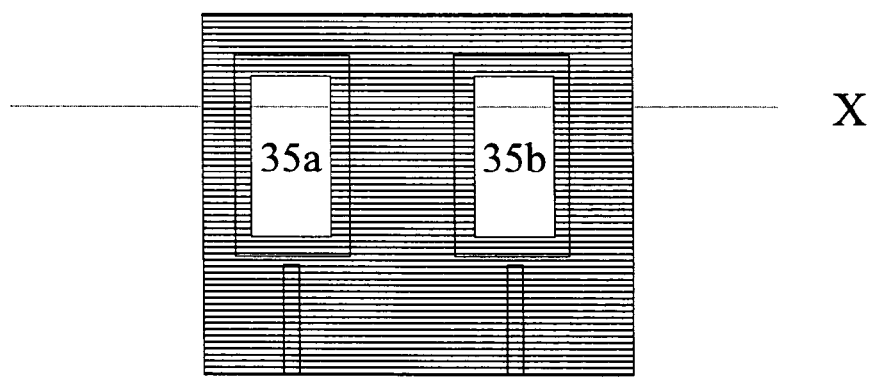
Figure 4C:
Figure 4C:
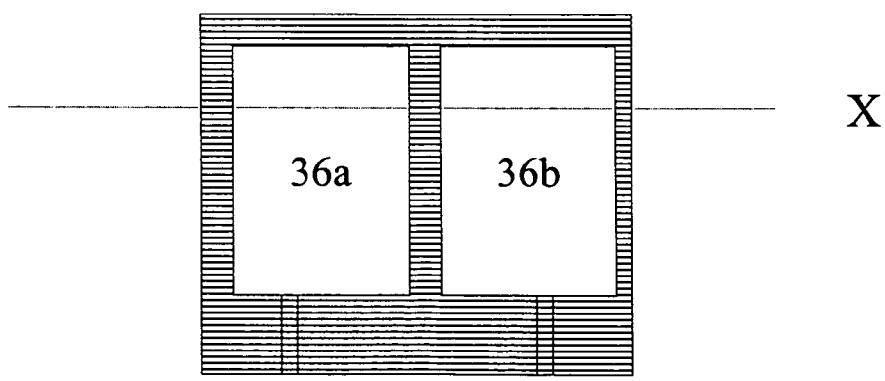

FIGS. 4A-4C show the top view of the process illustrated in FIGS. 3A-3G. FIG. 4A corresponds to FIG. 3B as the conductive lines 32a and 32b in FIG. 3B are the cross-section view of the conductive lines 32a and 32b in FIG. 4A, at line X. As aforementioned, each of the conductive lines has a larger conductive area on one side. FIG. 4B corresponds to FIG. 3E and shows that the photoimageable material has been applied, areas 34a and 34b have been removed by photolithography and a conductive metal has been plated in area 35a and 35b. FIG. 4C corresponds to FIG. 3G. The squares in FIG. 4C are the top view of the segment electrodes 36a and 36b in FIG. 3G.

The process of FIGS. 3A-3G completely avoids the use of via holes. Therefore all of the steps (e.g., resin filling and brushing) for the via hole plugging and planarization in the conventional process are eliminated. In addition, all of the materials used in the process are commercially available and therefore it can be conveniently carried out at low cost.

Figure 5A:
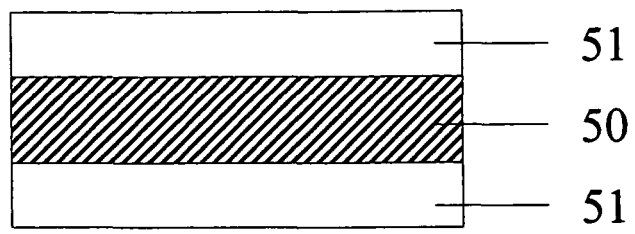
FIGS. 5A-5F demonstrate another alternative process of the present invention.
Figure 5B:
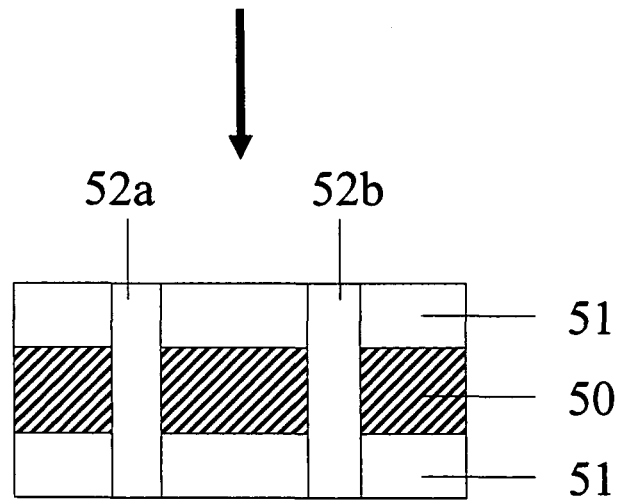
Figure 5C:
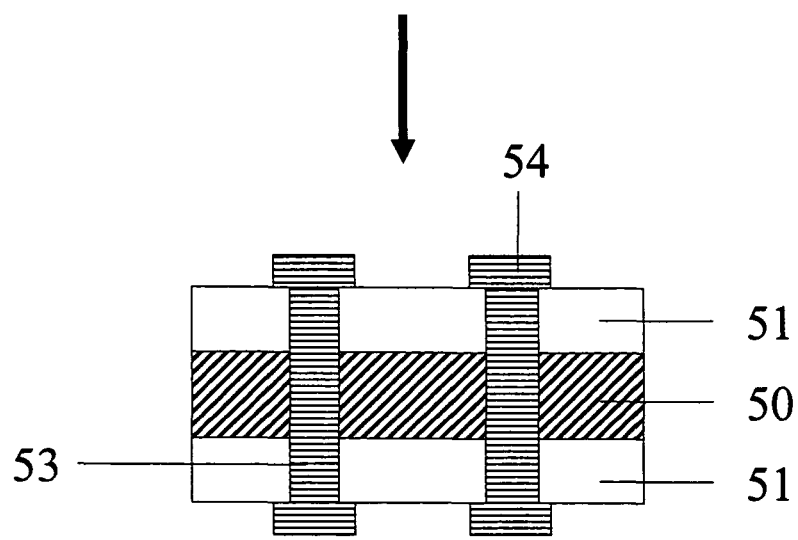

FIGS. 5A-5F illustrate a further alternative process of the present invention. The steps depicted in FIGS. 5A and 5B are identical to those of FIGS. 1A and 1B where the via holes (52a and 52b) are formed. In FIG. 5C, the via holes are filled with a conductive paste (53), such as a carbon paste, copper paste, nickel paste, cobalt paste, silver paste, silver coated copper paste, silver coated nickel paste, silver coated cobalt paste and composites or alloy pastes thereof, with the copper paste, silver paste and silver coated copper paste as the more preferred. The conductive paste may be applied to the via holes by roller coating, screen printing or injection filling, with screen printing as a more preferred option.

Figure 5D:
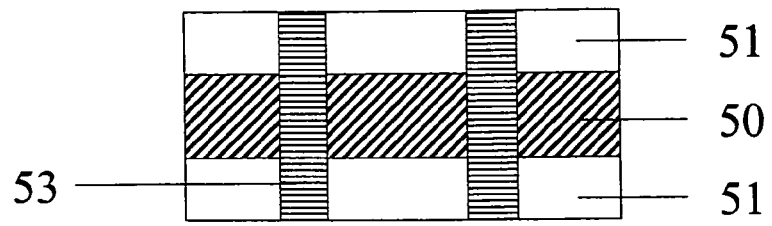
Figure 5E:
Figure 5E:
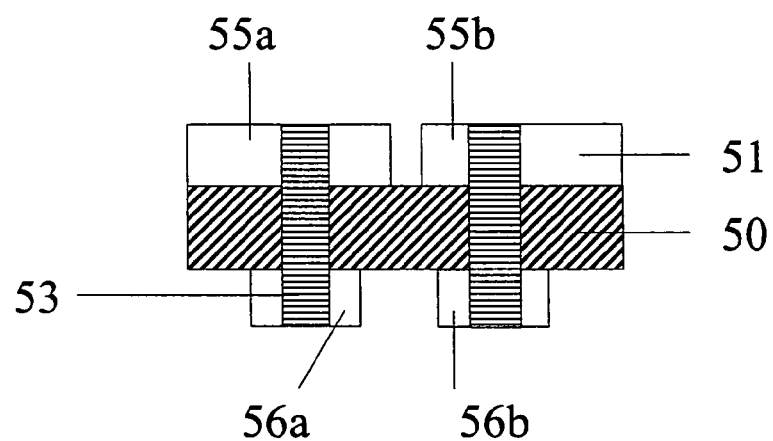
Figure 5F:
Figure 5F:
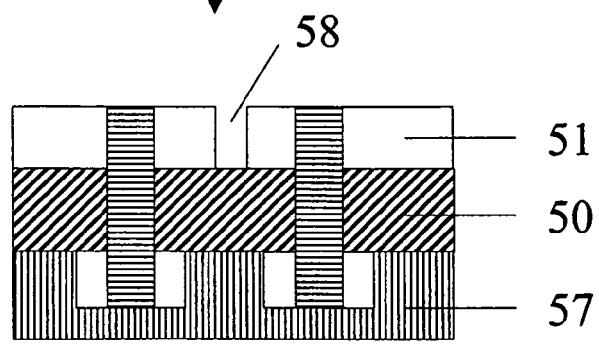

The conductive paste (53) may be hardened by thermal or radiation cure. The protrusions (54) formed from the conductive paste at the openings of the via holes may be removed by brushing, as shown in FIG. 5D. In FIG. 5E, photolithography and etching steps are performed to form the segment electrodes (55a and 55b) on one side and the conductive lines (56a and 56b) on the other side. Finally, a non-conductive material or solder mask (57) is coated on the conductive line side to complete the backplane assembly. In this backplane assembly, each of the segment electrodes (55a or 55b) is connected to a conductive line (56a or 56b respectively) through the conductive paste (53) inside via hole (52a or 52b respectively) as shown in FIG. 5F.

The thickness of the segment electrodes (in turn the depth of the gaps (58) between the segment electrodes) may be controlled to be less than about 10 microns. However, if the gaps are too deep to be acceptable, the gap plugging step of FIG. 2 may be applied to eliminate the gaps.

To prevent copper-based segment electrodes from corrosion during storage and shipping, a thin layer of nickel, tin or gold may be coated over them by electroless plating or electroplating.

EXAMPLE 1

A backplane with the well-known 14 segment electrode pattern for a numerical display was fabricated using the process flow from FIG. 1A to 1G. After the etching step, the depth of the gaps between the segment electrodes is about 40 microns. A Norland Optical Adhesive 61 (NOA61) was applied by syringe near one edge of the backplane. The solid content and viscosity of NOA61 are 100% and 300 centipoises at 25° C., respectively. A UV10 release film, supplied by CPFilms Inc., was laminated onto the backplane using a Hot Roll Laminator (Cheminstrument, Fairfield, Ohio) preset at a roller temperature of 200° F., a lamination speed of 1 cm/sec and a roll pressure of 50 psi. A UV curing station with UV intensity of 1.2 mw/cm$^2$ was used to cure the NOA61 filled in gaps. After curing, the UV10 release film was removed. The depth of gaps was reduced from 40 microns to less than 1 micron.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, materials, compositions, processes, process step or steps, to the objective and scope of the present invention. All such modifications are intended to be within the scope of the claims appended hereto.

What is claimed is:

1. A process for plugging gaps between segment electrodes in a direct drive display comprising display cells filled with an electrophoretic fluid wherein said electrophoretic fluid comprises charged pigment particles dispersed in a solvent, which process comprises the following steps in sequence:
   a) applying a thermal or radiation curable material in a liquid form to the top surface of the segment electrodes,
   b) laminating a release film over the top surface to squeeze the material into the gaps between the segment electrodes and controlling the lamination pressure with a nip roller,
   c) hardening the thermal or radiation curable material, and
   d) removing the release film after hardening of the thermal or radiation curable material.

2. A process for the manufacture of a backplane for a direct drive display comprising display cells filled with an electrophoretic fluid wherein said electrophoretic fluid comprises charged pigment particles dispersed in a solvent, which process comprises the following steps in sequence:
   a) forming conductive lines on a non-conductive substrate layer;
   b) covering the conductive lines with a photoimageable material;
   c) removing the photoimageable material in areas connected to the conductive lines to form open areas;
   d) leveling the open areas with a first conductive material to form conductive areas embedded in the photoimageable material;
   e) forming segment electrodes by plating a second conductive material over the photoimageable material;
   f) applying a thermal or radiation curable material in a liquid form to the top surface of the segment electrodes;
   g) laminating a release film over the top surface to squeeze the material into gaps between the segment electrodes and controlling the lamination pressure with a nip roller;
   h) hardening the thermal or radiation curable material; and
   i) removing the release film after hardening of the thermal or radiation curable material.

3. The process of claim 2 wherein said conductive lines are formed of copper.

4. The process of claim 2 wherein said photoimageable material is a solder mask, negative tone photoresist or positive tone photoresist.

5. The process of claim 2 wherein said photoimageable material is an epoxy-based solder mask.

6. The process of claim 2 wherein said thermal or radiation curable material has more than 85% (w/w) solid content.

7. A process for the manufacture of a backplane for a direct drive display comprising display cells filled with an electrophoretic fluid wherein said electrophoretic fluid comprises charged pigment particles dispersed in a solvent, which process comprises the following steps in sequence:
   a) forming via holes on a non-conductive substrate layer laminated or coated with a conductive material on both sides of the non-conductive substrate layer;
   b) filling the via holes with a conductive paste;
   c) forming segment electrodes on the conductive material laminated or coated on one side of the non-conductive substrate layer and forming conductive lines on the conductive material laminated or coated on the other side of the non-conductive substrate layer;
   d) applying a thermal or radiation curable material in a liquid form to the top surface of the segment electrodes;
   e) laminating a release film over the top surface to squeeze the material into gaps between the segment electrodes and controlling the lamination pressure with a nip roller;
   f) hardening the thermal or radiation curable material; and
   g) removing the release film after hardening of the thermal or radiation curable material.

8. The process of claim 7 wherein the via holes are formed by mechanical or laser drilling.

9. The process of claim 7 wherein the conductive paste is carbon paste, copper paste, nickel paste, cobalt paste, silver paste, silver coated copper paste, silver coated nickel paste, silver coated cobalt paste or a composite or alloy paste thereof.

10. The process of claim 7 wherein said thermal or radiation curable material has more than 85% (w/w) solid content.

11. The process of claim 1, wherein the thickness of the thermal or radiation curable material remaining on top surface of the segment electrode is 0.1 um or less.

12. The process of claim 2, wherein the thickness of the thermal or radiation curable material remaining on top surface of the segment electrode is 0.1 um or less.

13. The process of claim 7, wherein the thickness of the thermal or radiation curable material remaining on top surface of the segment electrode is 0.1 um or less.

14. The process of claim 1 wherein the thermal or radiation curable material has a dielectric constant in the range of about 1 to about 10.

15. The process of claim 2 wherein the thermal or radiation curable material has a dielectric constant in the range of about 1 to about 10.

16. The process of claim 7 wherein the thermal or radiation curable material has a dielectric constant in the range of about 1 to about 10.

* * * * *